United States Patent [19]
Winston, IV

[11] 3,965,438

[45] June 22, 1976

[54] FREQUENCY LOCKING SYSTEM FOR A VOLTAGE CONTROLLED SWEEP FREQUENCY OSCILLATOR

[75] Inventor: Fendall Gregory Winston, IV, Portland, Oreg.

[73] Assignee: Tektronix, Inc., Beaverton, Oreg.

[22] Filed: Oct. 29, 1974

[21] Appl. No.: 518,663

[52] U.S. Cl. ................................. 331/1 A; 331/4; 331/17; 331/25; 331/178
[51] Int. Cl.² ................. H03B 3/10; H03B 23/00
[58] Field of Search ............... 331/1 A, 4, 17, 18, 331/25, 178, 10, 11

[56] References Cited
UNITED STATES PATENTS

| | | | |
|---|---|---|---|
| 3,274,511 | 9/1966 | Dale et al. | 331/17 X |
| 3,364,437 | 1/1968 | Loposer et al. | 331/4 X |
| 3,441,870 | 4/1969 | Wicker | 331/17 X |

*Primary Examiner*—Siegfried H. Grimm
*Attorney, Agent, or Firm*—Adrian J. LaRue; Kenneth M. Durk

[57] ABSTRACT

A system for automatically maintaining the center frequency of a swept voltage controlled oscillator. At a known amplitude of sweep voltage input, a lock pulse is actuated. The oscillator output is divided by a number N and applied simultaneously with the reference signal to a phase and/or frequency detector. The detected signal is applied via a gate under the control of such lock pulse to a memorization unit whose output is used to maintain the center frequency.

5 Claims, 1 Drawing Figure

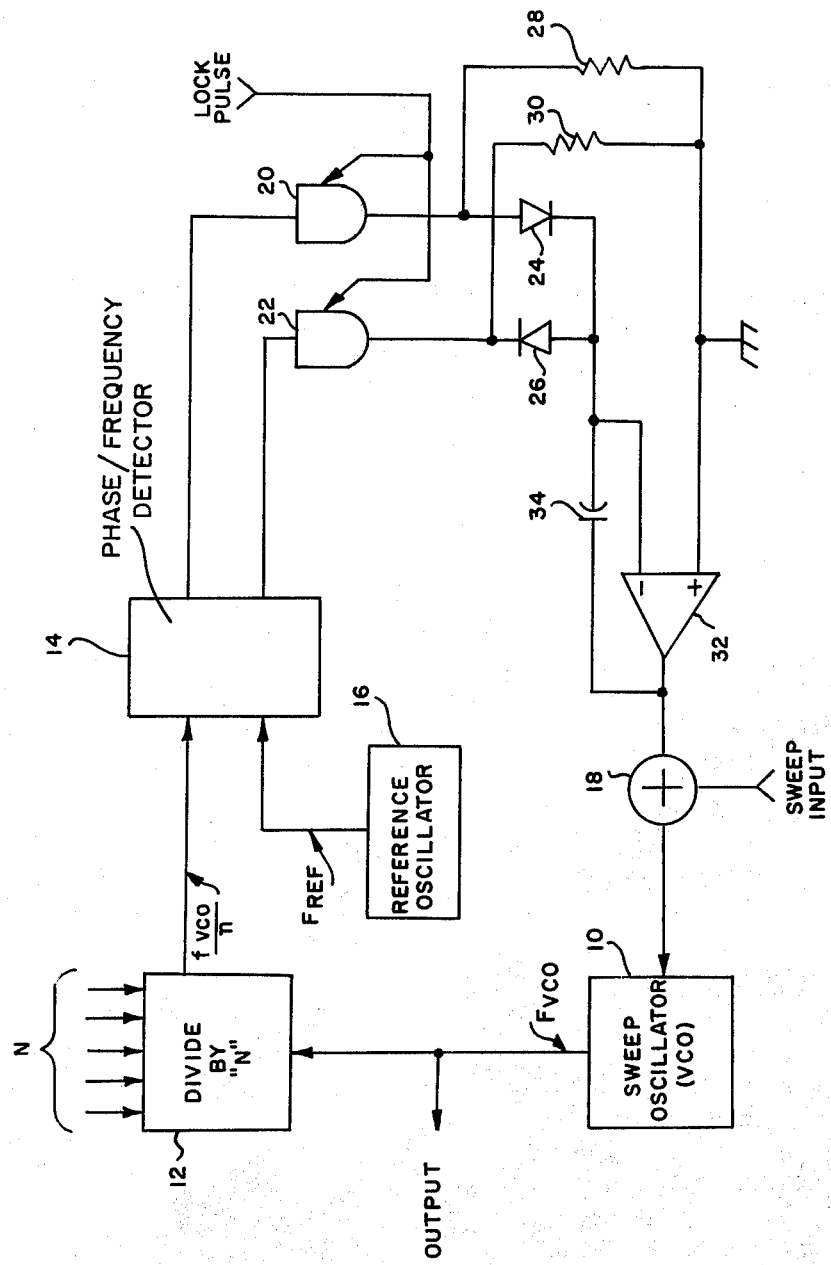

FREQUENCY LOCKING SYSTEM FOR A VOLTAGE CONTROLLED SWEEP FREQUENCY OSCILLATOR

BACKGROUND OF THE INVENTION

The use of an electronic instrument such as a spectrum analyzer to display on a cathode ray tube the amplitude and frequency of an electric signal is well known in the art. Unlike an oscilloscope which may be capable of displaying the waveform of a single transient, a spectrum analyzer usually requires a repetitive signal in order to provide a satisfactory display. This is so because at any one instant, the receiver portion of a sweeping spectrum analyzer can only be tuned to a single component of a frequency spectrum. Thus, if a frequency present in a single transient is not in coincidence with the frequency to which the spectrum analyzer is tuned at the time of occurance, it will not be displayed. (For examples, see "Spectrum Analyzer Measurements," Circuit Concepts, 1969, Tektronix, Inc., first edition).

Obviously, the capability of the spectrum analyzer to measure signals must infer that the oscillator(s) in the spectrum analyzer must be more stable than those whose frequency is to be measured.

The stabilization techniques of insuring that the oscillator(s) in the spectrum analyzer be more stable than those whose frequency is to be measured are well known in the art as step-tuned phaselock stabilization and continuously tuned phaselock stabilization. The continuously tuning, or sweeping, phaselock system is much more complicated than the step-tuned system but the stability improvement thereover makes the sweeping system the most attractive. However, each time the tuning frequency of a device under test is changed, the center frequency of the sweep generator must be manually adjusted else, the display of the electrical signal on the device may be positioned out of view. Thus, considerable attention and an appreciable amount of time by an operator are required.

SUMMARY OF THE INVENTION

According to this invention in its broadest aspects a swept frequency oscillator arrangement comprises a swept frequency oscillator and means for setting the center frequency of the swept frequency oscillator including a phase detector connected to compare oscillations of a continuous wave reference frequency and a stepped-down frequency via a frequency divider operably connected to a voltage controlled oscillator and producing a difference voltage with respect thereto. The difference voltage is gated, integrated and applied to control the voltage controlled oscillator. As the result of such technique, the center frequency is automatically set thus eliminating the need of additional circuits, etc., to manually set the center frequency.

It is therefore an object of the present invention to provide a frequency locking system which overcomes the limitations of the prior art.

It is another object of the present invention to provide a frequency locking system which automatically sets the center frequency of the system.

It is yet another object of the present invention to provide a frequency locking system having phaselock stabilization.

The foregoing and numerous other objects, advantages, and inherent functions of the present invention will become apparent as the same is more fully understood from the following description which describes the present invention; it is to be understood, however, that the embodiment is not intended to be exhausting nor limiting of the invention but is given for purposes of illustration in order that others skilled in the art may fully understand the invention and principles thereof and the manner of applying it in practical use so that they may modify it in various forms, each as may best be suited to the conditions of the particular use.

DESCRIPTION OF THE DRAWINGS

The single FIGURE is a hybrid block and schematic diagram of the frequency locking system in accordance with the present invention.

DESCRIPTION OF THE INVENTION

Referring now to the single FIGURE, a hybrid block and schematic diagram in accordance with the invention is illustrated. The output of the system is derived from a swept oscillator 10, hereinafter referred to as VCO 10. The frequency, $f$ vco, of VCO 10 is passed through a frequency divider 12 which divides $f$ vco by an integer N to provide an output therefrom with a stepped down frequency, $f$ vco/N. The divided down frequency, $f$ vco/N, is then coupled to a phase and frequency detector 14, $\Delta F/\Delta \phi$, which employs as a reference signal the frequency output, $f_{REF}$, of a reference oscillator 16. The phase and frequency detector provides a signal which is proportional to the phase or frequency difference of the reference signal and a sub-multiple of the VCO signal. This signal is then sampled, integrated and applied to control the voltage controlled oscillator. Operation of the VCO 10 to repetitively sweep over a band of frequencies in accordance with a sawtooth or ramp voltage applied thereto via summing means 18 is well known by those skilled in the art as well as the actual "circuit" of the VCO. Additionally, frequency divider 12 which divides $f$ vco by an integer N to provide the phase and frequency detector 14 with a stepped-down frequency $f$ vco/N provides a higher modulation index as is well known. Thus, there has been described portions of a conventional scanning spectrum analyzer wherein the sweep input defines a conventional sawtooth voltage which is also applied to control the horizontal deflection of the display device not shown.

Ideally, it is desired that the sweep input be at its center frequency or zero crossing at the same time the frequency divider 12 is switching through half of its output cycle; this condition will give exact synchronization. To accomplish this a lock pulse, derived from conventional means not shown, at the time of zero crossing is applied to a pair of logic means disposed between the outputs of the phase and frequency detector 14 and a pair of asymmetrically conducting devices. The pair of logic means define tri-logic gate means having inputs connected to receive outputs from the phase and frequency detector 14, control inputs to receive said lock pulse, and outputs connected to supply signals to said asymmetrically conducting devices; tri-level gate 20 connected to receive a first output signal from the phase and frequency detector, said first signal representative of any differential in frequency between $f$ vco/N and $f_{REF}$, and tri-level gate 22 connected to receive a second output signal from the phase and frequency detector, said signal representative of any differential in phase between $f$ vco/N and $f_{REF}$.

When a lock pulse occurs (during retrace time of the sawtooth waveform corresponding to the zero crossing), the tri-level gates 20, 22 transfer such first and second signals to the asymmetrical conducting devices. The asymmetrical conducting devices can be, for example, the diodes 24, 26 whose anode and cathode are connected to the outputs of the gates 20, 22, respectively and whose other electrodes are connected together. Additionally, the anode and cathode of the diodes 24, 26 are returned to a suitable source of potential via a pair of impedance means such as the resistors 28, 30. As shown in the FIGURE, a suitable source of potential can be ground ( ⊥ ). To those having ordinary skill in the art, the above describes that the diodes 24, 26 are connected to sample the said first and second signals, thus providing a sample voltage indicative of the phase difference between the frequencies $f_{REF}$ and $f$ voc/N and/or a sample voltage indicative of the frequency difference between the frequencies $f_{REF}$ and $f$ voc/N.

Connected in common with the cathode and anode of the diodes 24, 26 respectively is the inverting input of an amplifier means 32 having a single output terminal which is returned to said inverting input via a series connected capacitor 34 and whose other input, which is a non-inverting input, is connected to a source of suitable potential. As shown in the FIGURE, a suitable source of potential can be ground ( ⊥ ). Thus, amplifier means 32 along with capacitor 34 defines an integrator well known. The voltage across the terminals of the capacitor is then applied via summing means 18 to lock the frequency of the VCO 10 precisely to the center frequency. When the lock pulse is removed, the center frequency of the VCO is maintained by the charge stored in the capacitor 34. As tri-state logic is used, the voltage across the sampling diodes approaches zero volts and diode leakage is reduced to practically zero.

While there has been shown and described the preferred embodiment of the present invention, it will be apparent to those skilled in the art that many changes and modifications may be made without departing from the invention in its broader aspects. Therefore, the appended claims are intended to cover all such changes and modifications that fall within the true spirit and scope of the invention.

The invention is claimed in accordance with the following:

1. A frequency locking system for a voltage controlled swept frequency oscillator, comprising:
    a voltage controlled sweep frequency oscillator for generating an output having a frequency which varies as a function of a control input;
    a divider for dividing said output by an integer N;
    a phase and frequency detector responsive to the divided output and a reference signal for providing a plurality of detected signals;
    means for supplying said reference signal to said detector;
    means responsive to said detected signals for providing an error voltage representative of any differential in frequency and phase between both said divided output and said reference signal; and
    means for adding said error voltage to a sweeping voltage and being operatively connected to said oscillator for locking said oscillator to the center frequency of said sweeping voltage.

2. A frequency locking system for a voltage controlled sweep frequency oscillator in a spectrum analyzer system, comprising:
    a voltage controlled sweep frequency oscillator for generating an output having a frequency which varies as a function of a control input;
    a divider for dividing said output by an integer N;
    a phase and frequency detector responsive to the divided output and a reference signal for providing a plurality of detected signals;
    means for supplying said reference signal to said detector;
    means responsive to said detected signals for providing an error voltage representative of any differential in frequency and phase between both said divided output and said reference signal; and
    means for adding said error voltage to a sweeping voltage and being operatively connected to said oscillator for locking said oscillator to the center frequency of said sweeping voltage.

3. The system according to claim 2 wherein said means responsive to said detected signal comprises;
    logic means connected to receive said detected signals for providing a first signal representative of any differential in frequency and a second signal representative of any differential in phase between said divided output and said reference signal only during the center frequency time of the sweeping voltage;
    sampling means for sampling said first and second signals; and
    integrator means responsive to the sampled first and second signals for providing said error voltage.

4. The system according to claim 3 wherein said logic means define trilogic means.

5. The system according to claim 3 wherein said integrator means includes an amplifier and a capacitor.

* * * * *